United States Patent [19]

Jopke, Jr. et al.

[11] Patent Number: 4,486,946
[45] Date of Patent: Dec. 11, 1984

[54] METHOD FOR USING TITANIUM-TUNGSTEN ALLOY AS A BARRIER METAL IN SILICON SEMICONDUCTOR PROCESSING

[75] Inventors: Walter H. Jopke, Jr., Bloomington; John S. Shier, Apply Valley, both of Minn.

[73] Assignee: Control Data Corporation, Minneapolis, Minn.

[21] Appl. No.: 513,208

[22] Filed: Jul. 12, 1983

[51] Int. Cl.$^3$ .................................... H01L 21/281
[52] U.S. Cl. .................................. 29/590; 29/578; 29/591; 357/67
[58] Field of Search .................. 29/578, 590, 591; 357/34, 67, 71; 427/88, 89, 90

[56] References Cited

U.S. PATENT DOCUMENTS

| | | | |
|---|---|---|---|
| 3,108,359 | 10/1963 | Moore | 29/590 |
| 3,858,304 | 1/1975 | Leedy et al. | 29/578 |
| 3,900,944 | 8/1975 | Fuller et al. | 29/578 |
| 4,011,144 | 3/1977 | Bachman | 204/15 |
| 4,146,413 | 3/1979 | Yonezawa et al. | 29/590 |
| 4,216,574 | 8/1980 | Feist | 29/590 |
| 4,267,012 | 5/1981 | Pierce et al. | 156/643 |
| 4,290,188 | 9/1981 | Ichinose et al. | 29/578 |
| 4,292,730 | 10/1981 | Ports | 29/383 |
| 4,300,149 | 11/1981 | Howard | 357/71 |
| 4,325,181 | 4/1982 | Yoder | 29/571 |
| 4,326,330 | 4/1982 | LePage et al. | 29/578 |
| 4,358,891 | 11/1982 | Roesner | 29/571 |
| 4,361,599 | 11/1982 | Wourms | 427/90 |

Primary Examiner—Brian E. Hearn
Assistant Examiner—Hunter L. Auyang
Attorney, Agent, or Firm—Edward P. Heller, III; Joseph A. Genovese

[57] ABSTRACT

A method for producing an NPN semiconductor device which has a titanium-tungsten barrier metal only in the N type contact windows is disclosed. A semiconductor wafer first undergoes the washed emitter process with the result that the N type collector and emitter contact windows are exposed to bare silicon and the P type contact windows are covered by a layer of silicon dioxide. A layer of titanium-tungsten alloy is deposited on the surface of the wafer. The titanium-tungsten layer is etched out of the P type contact regions using standard photolithographic techniques. The underlying layer of silicon dioxide in the P type contact regions is then also etched away. A layer of aluminum is then deposited across the surface of the wafer. The conductor interconnect photolithography is used to etch away all undesired aluminum. The remaining portions of the titanium-tungsten layer, not covered by aluminum signal lines, are then also etched away. This results in a structure which has titanium-tungsten barrier metal sandwiched between the aluminum signal lines and the silicon in the N type collector and emitter contact windows, but not in the P type contact windows.

3 Claims, 9 Drawing Figures

METHOD FOR USING TITANIUM-TUNGSTEN ALLOY AS A BARRIER METAL IN SILICON SEMICONDUCTOR PROCESSING

BACKGROUND

The invention relates to methods for providing a barrier metal between an aluminum metalization layer and the silicon surface of a semiconductor wafer.

One of the difficulties in obtaining high yields of bipolar LSI and VLSI integrated circuits is in obtaining good quality thin films for the standard two or more layer metallization schemes. One of the most serious problems has to do with making sure that these films are able to adequately cover topographical steps on the silicon wafer surface and maintain integrity as they do so. By far, the metal element most commonly used in the semiconductor industry for metal interconnects is aluminum. Unfortunately, aluminum has an affinity for silicon during the sintering process which results in the aluminum signal line pitting through and shorting out shallow junctioned bipolar devices. The answer to this problem has been to utilize aluminum alloys containing silicon. While this solves the pitting problem, it causes difficulties with thin film step coverage. When the aluminum silicon layer has been etched to define the metalization interconnect pattern, the silicon in the alloy is left behind in the form of small nodules. These nodules serve as nucleation centers during subsequent dielectric chemical vapor deposition and produce a very rough surface and even bulbs at steps, resulting in a surface which is very difficult to cover with another layer of metal.

A solution to this problem has been to use non-silicon containing alloys of aluminum together with a barrier metal between the aluminum and the silicon to prevent alloy pitting. A very good candidate for this barrier metal is titanium-tungsten alloy. Unfortunately, titanium-tungsten makes good ohmic contact to N type silicon but not to P type. Past process utilizing titanium-tungsten have, therefore, necessitated the use of an extra photolithographic masking operation, making the process more complex and costly. That is, in the past, the titanium-tungsten layer had to be defined by photolithographic means and then etched from the P type contact windows prior to depositing the aluminum metalization layer.

SUMMARY

The present invention avoids the problems of the prior art methods by eliminating the extra photolithographic etching step previously required to pattern the titanium-tungsten layer. According to the method of the present invention, the titanium-tungsten layer is deposited over a structure consisting of washed emitter NPN devices, having emitter and collector N type contact windows exposed to bare silicon, and the P type contact windows covered by a layer of silicon dioxide. Standard photolithography techniques are used to pattern the titanium-tungsten such that the barrier metal layer, and the silicon dioxide layer are etched out of the P type contact windows. The aluminum layer is then deposited and patterned using the interconnect photolithography. All titanium-tungsten not protected by the aluminum signal lines is then etched away so that the titanium-tungsten barrier separates the aluminum conductors from the silicon of the N type collector and emitter contact windows, but not from the silicon of the P type contact windows.

DESCRIPTION OF THE PRESENTLY PREFERRED EMBODIMENT OF THE INVENTION

In the presently preferred embodiment of the invention, the silicon wafer first undergoes the washed emitter process in order to produce a device having the N type emitter and collector contact windows exposed to the bare silicon and the P type contact windows covered by a layer of silicon dioxide. This washed emitter process will be described first. Preliminarily, however, note that the FIGS. 1-9 are not intended to be scale and that certain portions of each of the figures are enlarged for clarity in description.

Figure 1:
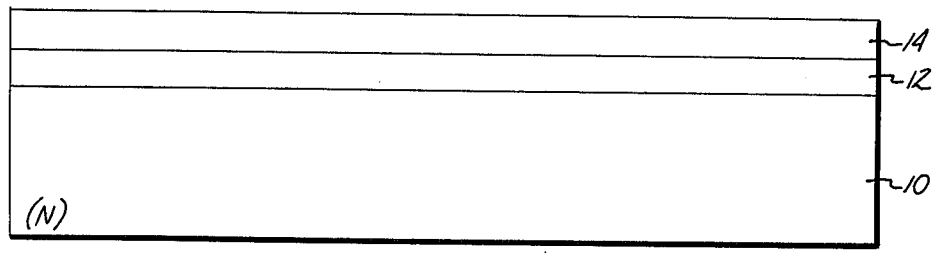
FIG. 1 shows an elevational view of a portion of an epitaxial layer 10 of a wafer at an early step in the process.
Figure 2:
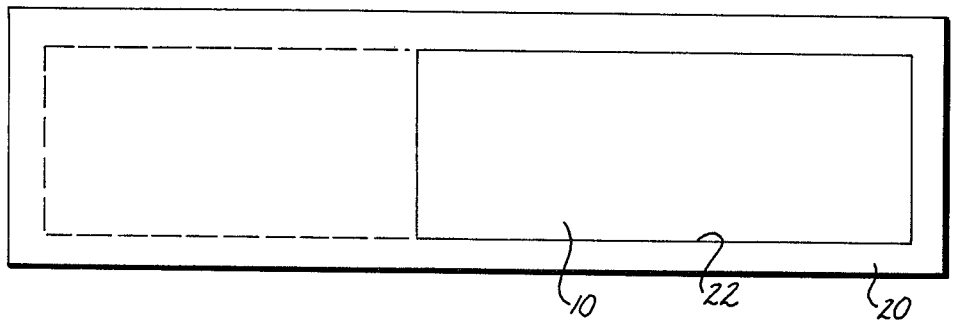
FIG. 2 shows a plan view of the wafer of FIG. 1 with a mask 20 superimposed thereupon.
Figure 3:
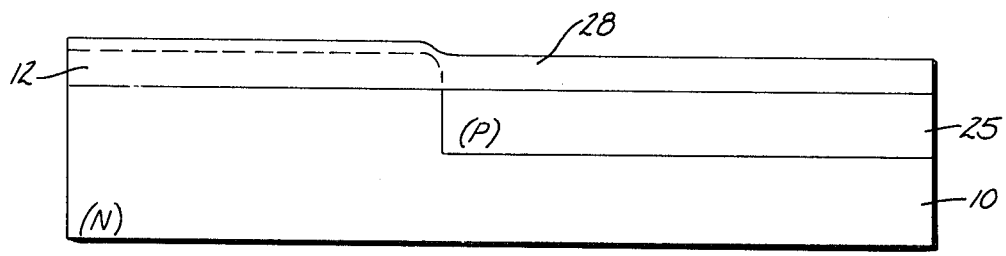
FIGS. 3-8 show elevational views of the wafer during successive stages of the process.
Figure 4:
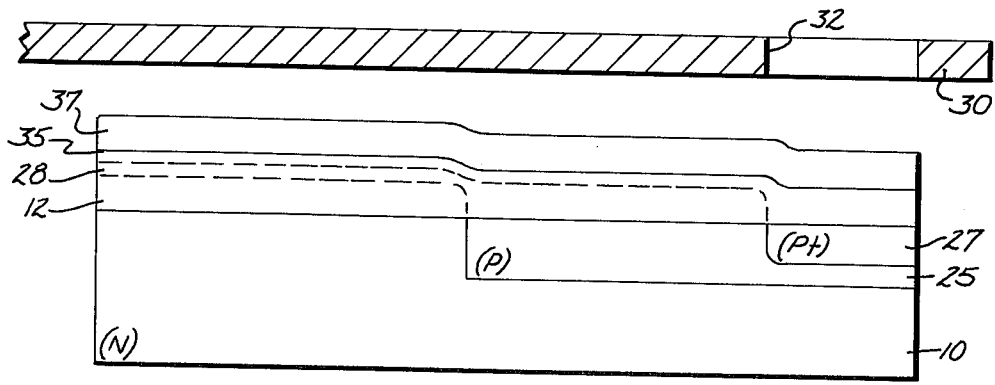
Figure 5:
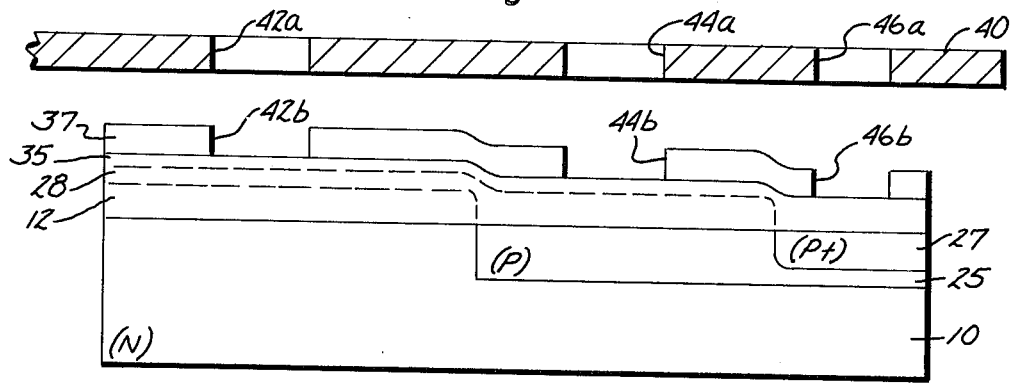

A portion of the N type epitaxial layer 10 of the wafer to be processed is shown in FIG. 1. The portion of epitaxial layer 10 shown in FIG. 1 will be processed into an NPN transistor device. Obviously, while only one NPN transistor device will be shown and described, the process is being simultaneously carried out on many like NPN devices. Moreover, not only can NPN type transistors be overlaid with signal lines and barrier metal using the present process, but in addition, the P type contact windows isolated and protected from barrier metal by the process are not exclusively base contact windows, but could also be P type contact windows for resistors or diodes, for example.

To apply the washed emitter process to the epitaxial layer 10 shown in FIG. 1, the wafer is first placed in a furnace tube in the presence of oxygen gas to grow a layer of silicon dioxide 12 on the surface of epitaxial layer 10. According to the conventional photolithography process, the silicon dioxide layer 12 is first covered with a layer of photoresist 14. Ultraviolet light is projected onto the photoresist layer 14 through the opening 22 of a mask 20. See FIG. 2. The portion of photoresist layer 14 exposed by opening 22 is then removed using a developer to expose the silicon dioxide layer 12. This exposed portion of the silicon dioxide layer 12 is then etched down to the bare silicon using a wet chemical etch. The remaining portion of photoresist layer 14 is then removed. Opening 22 has defined what will now become the base region of one NPN device on the epitaxial layer 10. The wafer is placed in a pre-deposition tube and a P type dopant (boron) passes down the tube and is deposited onto the wafer. The wafer is then placed in a second tube which contains oxygen and/or steam which drives the boron dopant into the epitaxial layer 10, where the bare silicon has been exposed, to form the P type base region 25. See FIG. 3. This is the drive-in step. The silicon dioxide layer 12 shields the other portions of the epitaxial layer 10 from the dopant. A new layer of silicon dioxide 28 is grown across the surface of the wafer as a consequence of the drive-in step.

Next, we use a mask 30 (shown in FIG. 4) having an opening 32 to etch away the silicon dioxide layer 28 to expose a portion of the base 25 to the bare silicon again. The two step doping process just described is repeated to more heavily dope this isolated portion of base 25 and thereby form base contact region 27. See FIG. 4. Again, a new layer of silicon dioxide 35 is grown during the drive-in step.

Next, a silicon nitride layer 37 is deposited across the wafer using standard low pressure chemical vapor deposition techniques. See FIG. 4. A photolithographic mask 40 having openings 42a, 44a and 46a is used to etch corresponding windows 42b, 44b, and 46b in the silicon nitride layer 37. See FIG. 5. A mask 50 (shown in FIG. 6) having oversized openings 52a and 54a is then used to select the corresponding windows 42b and 44b, which were etched in the previous step. These windows, 42b and 44b, delineate what will become the NPN collector and emitter contact regions, respectively. The silicon dioxide layers 12, 28, 35 are then etched to form the windows 52b, 54b, shown in FIG. 6. Note that the actual etched windows 52b, 54b correspond to the patterns defined by windows 42b, 44b and not by the oversized windows 52a, 54a. The etchant used for silicon dioxide does not significantly etch the silicon nitride layer 37. Hence, the windows 52a, 54a can be oversized to eliminate the problem of imprecise alignment between the windows of mask 50 and the windows 42b, 44b of the silicon nitride layer 37.

Figure 6:
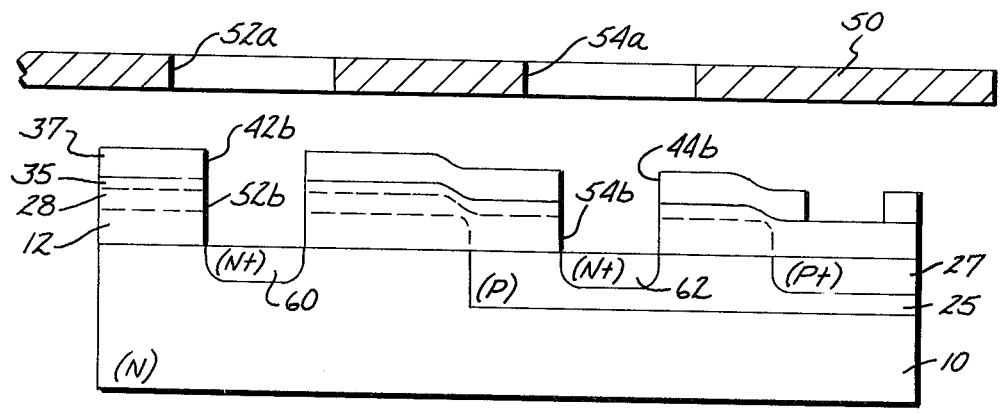
Figure 7:
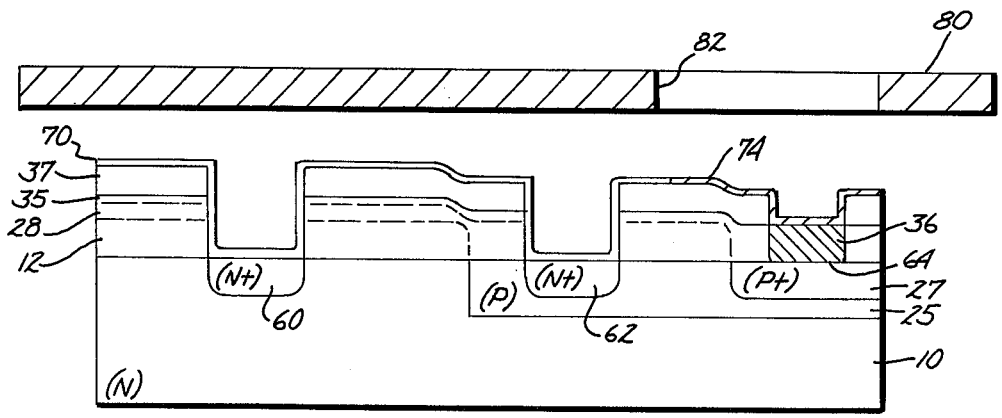
Figure 8:
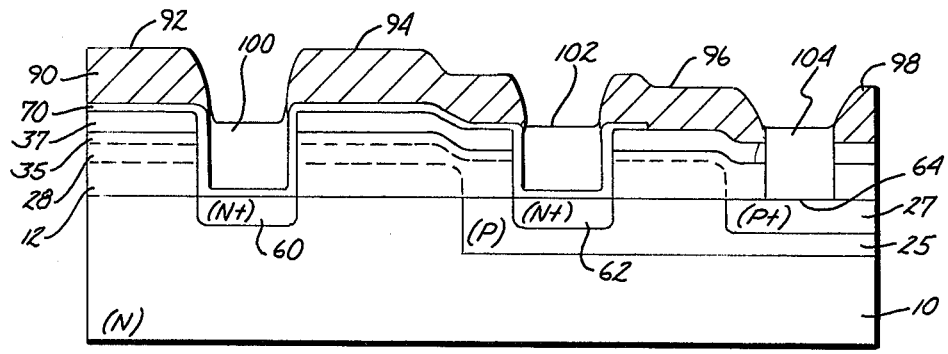

Now, we want to dope the silicon exposed in windows 52b and 54b with a N type dopant to form the collector and emitter contact regions of the NPN transistor device. In a washed emitter process, this is done by minimizing the amount of silicon dioxide which is grown during the diffusion of the N type dopant into the epitaxial layer 10. The wafer (as shown in FIG. 6) is placed in a doping tube and an N type dopant such as phosphorous is deposited onto the silicon in windows 52b, 54b. This is analogous to the predeposition step of the conventional two step process. To avoid the growth of another layer of silicon dioxide, we do not follow through with the drive-in step, but instead, we rely on the predeposition step alone to diffuse the N type dopant into the silicon to the necessary extent to form the collector contact region 60 and emitter contact region 62. Actually, a very thin layer of silicon dioxide is unavoidably grown on the wafer as a result of the predeposition step alone. This thin layer can, however, be "washed" (actually etched) away using a nonmasked wet chemical etch. Hence, the terminology "washed emitter process." FIG. 6 shows the NPN transistor device produced by this well known process having the collector and emitter contact windows 60, 62 exposed to bare silicon, while the base contact window (underlying window 46b) is covered by silicon dioxide layer 35.

Figure 9:
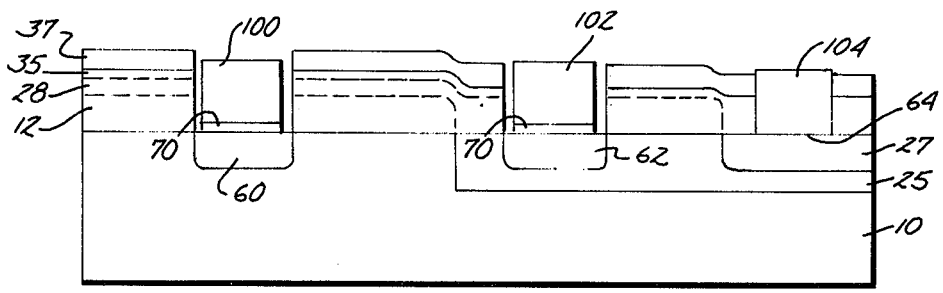
FIG. 9 shows the wafer at the end of the process.

Now, according to the method of the present invention, a layer 70 of titanium-tungsten alloy is sputtered across the surface of the wafer. See FIG. 7. The titanium-tungsten layer 70 makes direct contact with the silicon in the collector and emitter contact windows 60, 62 and with the silicon dioxide layer 35 overlying the base contact windows. We now perform the P type silicon contact photolithography using a mask 80 having an opening 82 to etch away the corresponding portion 74 (shown in FIG. 7) of the titanium-tungsten layer 70. We then etch a window 36 (shown in FIG. 7) in silicon dioxide layer 35 to expose the base contact window 64 in base contact region 27 to bare silicon. Now we deposit the first layer of aluminum metallization 90 across the wafer 10. See FIG. 8. We next pattern the aluminum layer 90 using the first layer interconnect photolithography and etch away the portions of 92, 94, 96, 98 of aluminum layer 90 to produce signal lines 100, 102, and 104. We then etch away those remaining portions of the titanium-tungsten layer 70 which are not covered by the aluminum signal lines 100 and 102 by using the photoresist covered aluminum signal lines themselves as a mask. The remaining photoresist is removed. Note that the photoresist could be removed before etching the titanium-tungsten layer in that the etchant used for titanium-tungsten will not etch aluminum. The remaining portions of the silicon dioxide layers of 12, 28 and 35, and silicon nitride layer 37 are left untouched in the normal fashion. The resulting structure is shown in FIG. 9 wherein the titanium-tungsten layer 70 provides a barrier between the aluminum signal lines 100 and 102 and the silicon in the N type collector and emitter contact windows 60, 62, but not in the P type base contact window 64.

Consequently, no extra photolithographic step is necessary to define the titanium-tungsten layer 70 since it is initially removed from the base contact window 64 when the silicon-dioxide layer is removed and later etched using the aluminum signal lines as a mask. We can, therefore, protect shallow junction bi-polar structures without introducing silicon nodules. We can put barrier metal in the N type silicon contact windows, but not in the P type silicon contact windows, without significantly adding complexity to the manufacturing process. We have added one metal deposition and two non-critical etching steps in exchange for eliminating the extra photolithographic masking operation.

Having disclosed the presently preferred embodiment of the invention, many modifications and variations will be obvious to those skilled in the art and the invention is accordingly intended to be limited only by the scope of the appended claims.

We claim:
1. A method for selectively applying barrier metal to the surface of a NPN type semiconductor wafer, comprising the steps of:
 (a) processing the silicon wafer to produce an NPN transistor device having emitter contact windows exposed to N type silicon, collector contact windows exposed to N type silicon, and P type contact windows covered by a layer of silicon dioxide;
 (b) depositing a layer of an alloy of titanium-tungsten on the semiconductor surface;
 (c) etching the titanium-tungsten layer out of the P type contact windows;
 (d) etching the silicon dioxide layer out of the P type contact windows to expose the P type silicon;
 (e) depositing a metalization layer of aluminum on the semiconductor wafer;
 (f) using conductor interconnect photolithography to etch away the undesired portions of the aluminum layer to define the aluminum signal lines; and
 (g) etching away those portions of the titanium-tungsten layer not covered by the aluminum signal lines whereby titanium-tungsten provides a barrier metal between the aluminum signal lines and the silicon of the N type emitter and collector contact windows, and wherein the aluminum signal lines connect directly to the P type silicon contact windows.

2. The process of claim 1 wherein a washed emitter process is used to produce said NPN transistor device having said N type emitter and collector contact windows exposed to bare silicon, and said P type contact windows covered by a layer of silicon dioxide.

3. The process of claim 1 wherein said P type contact windows are NPN transistor base contact windows.

* * * * *